United States Patent
Yasuhara et al.

(10) Patent No.: US 7,218,106 B2
(45) Date of Patent: May 15, 2007

(54) MRI WITH AUTOMATIC CONTOUR-CONTROLLED SEPARATION BETWEEN RF COIL AND OBJECT BEING IMAGED

(75) Inventors: Yasutake Yasuhara, Nishinasuno-machi (JP); Kazuya Okamoto, Saitama (JP); Masaaki Yamanaka, Otawara (JP); Manabu Ishii, Otawara (JP); Tsutomu Igarashi, Otawara (JP); Shigehide Kuhara, Otawara (JP)

(73) Assignees: Kabushiki Kaisha Toshiba, Tokyo (JP); Toshiba Medical Systems Corporation, Otawara-shi, Tochigi (JP)

( * ) Notice: Subject to any disclaimer, the term of this patent is extended or adjusted under 35 U.S.C. 154(b) by 36 days.

(21) Appl. No.: 10/950,698

(22) Filed: Sep. 28, 2004

(65) Prior Publication Data

US 2005/0122108 A1 Jun. 9, 2005

(30) Foreign Application Priority Data

Dec. 4, 2003 (JP) ............................. 2003-405779
Feb. 19, 2004 (JP) ............................. 2004-042863

(51) Int. Cl.
*G01V 3/00* (2006.01)
(52) U.S. Cl. .................................................. 324/307
(58) Field of Classification Search ................ None
See application file for complete search history.

(56) References Cited

U.S. PATENT DOCUMENTS

| 4,830,012 A | 5/1989 | Riederer |
| 4,875,485 A | 10/1989 | Matsutani |
| 5,085,219 A | 2/1992 | Ortendahl et al. |
| 5,197,474 A | 3/1993 | Englund et al. |
| 5,352,981 A * | 10/1994 | Machida ...................... 324/309 |
| 5,384,536 A | 1/1995 | Murakami et al. |
| 5,461,314 A | 10/1995 | Arakawa et al. |
| 5,510,711 A | 4/1996 | Molyneaux et al. |
| 5,539,316 A | 7/1996 | Sukumar |
| 5,551,430 A | 9/1996 | Blakeley et al. |

(Continued)

FOREIGN PATENT DOCUMENTS

GB 2350682 6/2000

(Continued)

OTHER PUBLICATIONS

U.S. Appl. No. 09/841,171, filed Apr. 2001, Kuhara.

(Continued)

*Primary Examiner*—Dixomara Vargas
(74) *Attorney, Agent, or Firm*—Nixon & Vanderhye P.C.

(57) ABSTRACT

A magnetic resonance imaging apparatus of the invention comprises a static magnetic field generation unit which generates a static magnetic field in a gantry, a gradient magnetic field generation unit which applies a gradient magnetic field to a object in the static magnetic field, a radio frequency coil which receives a magnetic resonance signal from the object to which the gradient magnetic field is applied, a contour detection unit which detects a contour of the object, a coil movement unit which moves the radio frequency coil on the basis of the detected contour while the radio frequency coil is placed near and far relative to the object, and an image generation unit which generates a magnetic resonance image on the basis of the received magnetic resonance signal.

39 Claims, 10 Drawing Sheets

U.S. PATENT DOCUMENTS

| | | | |
|---|---|---|---|
| 5,585,724 | A | 12/1996 | Morich et al. |
| 5,713,358 | A | 2/1998 | Mistretta et al. |
| 5,757,189 | A * | 5/1998 | Molyneaux et al. ......... 324/318 |
| 5,909,119 | A | 6/1999 | Zhang et al. |
| 5,924,987 | A | 7/1999 | Meaney et al. |
| 5,928,148 | A * | 7/1999 | Wang et al. ................. 600/420 |
| 6,147,492 | A | 11/2000 | Zhang et al. |
| 6,262,576 | B1 | 7/2001 | Petropoulos |
| 6,263,228 | B1 | 7/2001 | Zhang et al. |
| 6,275,722 | B1 | 8/2001 | Martin et al. |
| 6,278,276 | B1 | 8/2001 | Morich et al. |
| 6,289,232 | B1 | 9/2001 | Jakob et al. |
| 6,356,780 | B1 | 3/2002 | Licato et al. |
| 6,380,741 | B1 | 4/2002 | Hajnal et al. |
| 6,385,480 | B1 * | 5/2002 | Bachus et al. ............... 600/411 |
| 6,396,269 | B1 | 5/2002 | Hajnal et al. |
| 6,445,181 | B1 * | 9/2002 | Pelc et al. .................. 324/307 |
| 6,459,922 | B1 | 10/2002 | Zhang |
| 6,556,009 | B2 | 4/2003 | Kellman et al. |
| 6,717,406 | B2 | 4/2004 | Sodickson |
| 6,731,969 | B2 * | 5/2004 | Van Vaals et al. .......... 600/410 |
| 6,759,847 | B2 * | 7/2004 | Brinker et al. ............... 324/309 |
| 6,841,999 | B2 * | 1/2005 | Arneth et al. ............... 324/309 |
| 2002/0021128 | A1 | 2/2002 | Kuhara |

FOREIGN PATENT DOCUMENTS

| | | |
|---|---|---|
| JP | 64-37939 | 2/1989 |
| JP | 6-317672 | 11/1994 |
| JP | 2001-198100 | 7/2001 |
| JP | 2002-10992 | 1/2002 |

OTHER PUBLICATIONS

Jones et al., "Dynamic, Contrast Enhanced, NMR Perfusion Imaging of Regional Cerebral Ischaemia in Rats using k Space Substitution", SMRM 1138, Aug. 8-14, 1992.

Ra et al., "Fast Imaging Method Using Multiple Receiver Coils with Subencoding Data Set", 10$^{th}$ Annual Meeting SMRM 1240, 1991.

Ra et al., "Fast Imaging Using Subencoding Data Sets from Multiple Detectors", MRM 30"142-145 (1993).

Pruessmann et al., "SENSE: Sensitivity Encoding for Fast MRI", MRM 42:952-962 (1999).

* cited by examiner

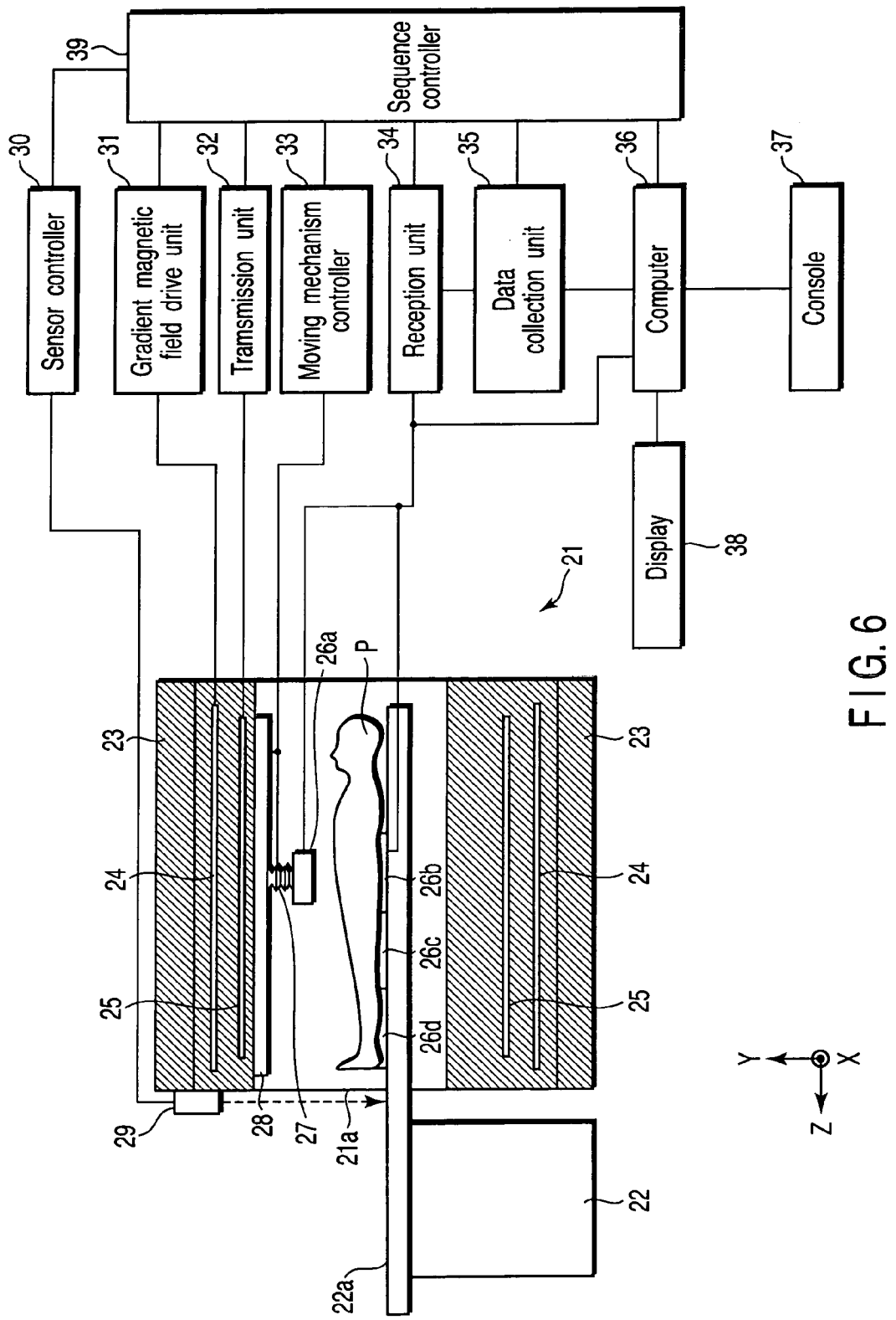
F I G. 6

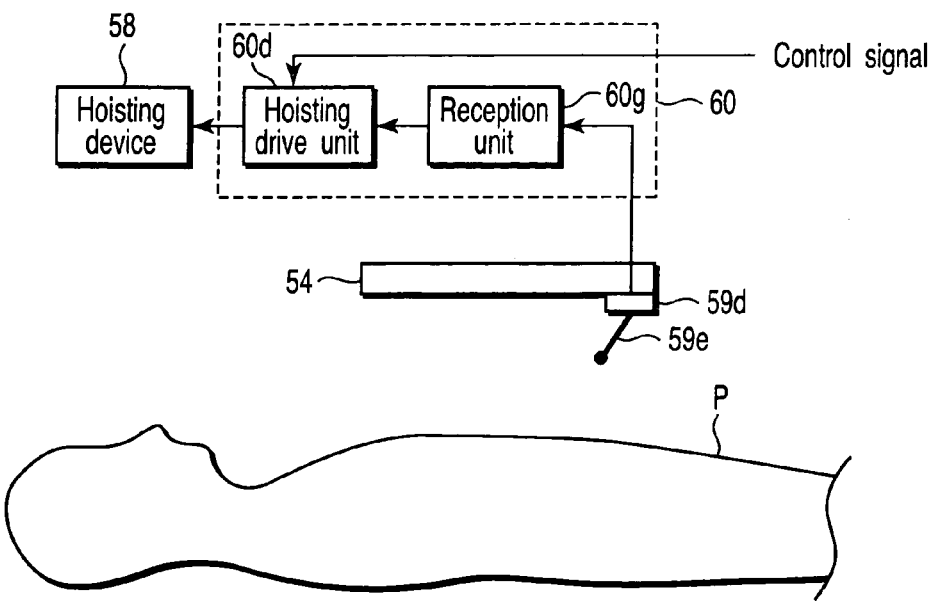
F I G. 13A
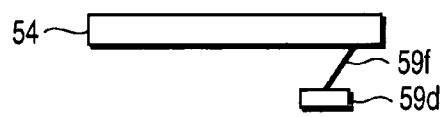
F I G. 13B
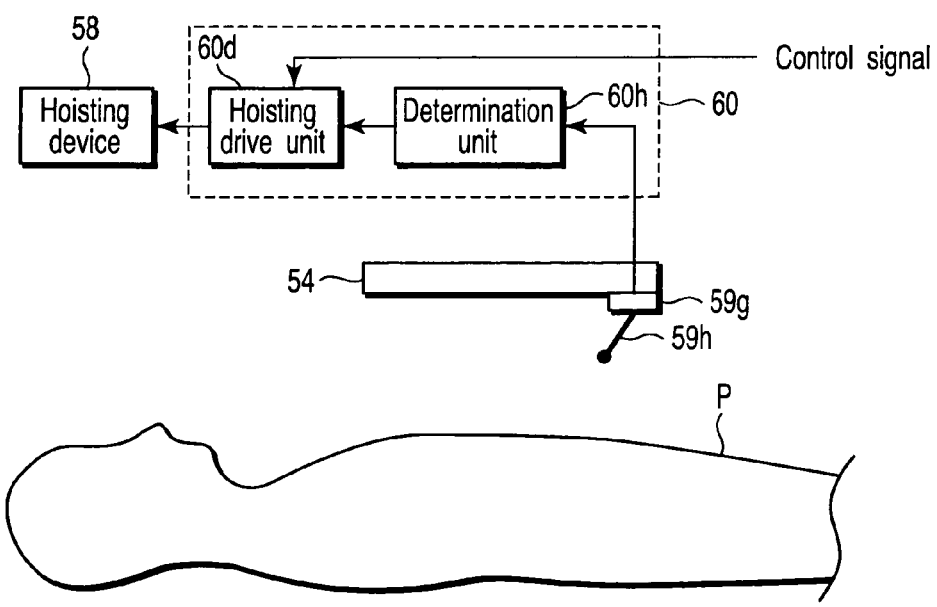
F I G. 14

MRI WITH AUTOMATIC CONTOUR-CONTROLLED SEPARATION BETWEEN RF COIL AND OBJECT BEING IMAGED

CROSS-REFERENCE TO RELATED APPLICATIONS

This application is based upon and claims the benefit of priority from prior Japanese Patent Applications No. 2003-405779, filed Dec. 4, 2003; and No. 2004-042863, filed Feb. 19, 2004, the entire contents of both of which are incorporated herein by reference.

BACKGROUND OF THE INVENTION

1. Field of the Invention

The present invention relates to a magnetic resonance imaging (MRI) apparatus which utilizes a magnetic resonance phenomenon to generate a magnetic resonance image and an image generation method in the MRI apparatus.

2. Description of the Related Art

A magnetic resonance imaging apparatus is one which visualizes chemical and physical micro information of a substance or observes a chemical shift spectrum by utilizing the phenomenon in which a group of nuclei resonantly absorbs energy of a radio frequency magnetic field rotated at a specific frequency when the group of nuclei having intrinsic magnetic moments is placed in a uniform static magnetic field.

For example, a diagnostic image is taken by the magnetic resonance imaging apparatus as follows: A patient is placed in a combined magnetic field including a static magnetic field formed by a magnet and a gradient magnetic field formed by a gradient magnetic field coil. A radio frequency wave having a predetermined frequency is applied to the patient set in the above-described situation in order to generate the magnetic resonance phenomenon. A magnetic resonance signal is generated by the applied radio frequency wave in the patient, and the magnetic resonance signal is received with a reception radio frequency coil to form the image.

In such an MRI apparatus, U.S. Pat. No. 5,928,148 (hereinafter referred to as First Reference) and U.S. Pat. No. 5,808,468 (hereinafter referred to as Second Reference) are well known as a technology which enlarges an imaging range.

In the MRI apparatus disclosed in First Reference, vertically divided coils are previously fixed to an imaging region in a gantry, and the image can be obtained in a wide region while a patient is moved between the vertically divided coils.

In the MRI apparatus disclosed in Second Reference, a table for holding a coil is placed on an already-existing couch as means for vertically fixing coils. A second movable couch is placed on the table, and the patient loaded on the second couch is conveyed into the gantry in a sliding manner.

However, in the technologies disclosed in First Reference and Second Reference, since the coil is fixed, a distance between the coil and the patient is increased, and sensitivity can not be efficiently increased.

An MRI apparatus including a whole body radio frequency coil and a movable surface coil is disclosed in Jpn. Pat. Appln KOKAI Publication No. 64-37939 (hereinafter referred to as Third Reference).

However, in the technology disclosed in Third Reference, because the imaging is performed after the surface coil is brought close to the imaging region, the imaging range in one time becomes narrow.

BRIEF SUMMARY OF THE INVENTION

In view of the foregoing, it is demanded that a high-quality imaging using a local radio frequency coil is performed in a wide range of a patient without attaching a probe to the patient.

According to first aspect of the present invention, there is provided a magnetic resonance imaging apparatus comprising: a static magnetic field generation unit which generates a static magnetic field in a gantry; a gradient magnetic field generation unit which applies a gradient magnetic field to a object in the static magnetic field; a radio frequency coil which receives a magnetic resonance signal from the object to which the gradient magnetic field is applied; a controller which detects a contour of the object; a coil movement unit which moves the radio frequency coil on the basis of the detected contour while the radio frequency coil is placed near and far relative to the object; and an image generation unit which generates a magnetic resonance image on the basis of the received magnetic resonance signal.

According to second aspect of the present invention, there is provided a magnetic resonance imaging apparatus comprising: a static magnetic field generation unit which generates a static magnetic field in a gantry; a gradient magnetic field generation unit which applies a gradient magnetic field to a object in the static magnetic field; a radio frequency coil which receives a magnetic resonance signal from the object to which the gradient magnetic field is applied; a controller which detects a contour of the object on the basis of the magnetic resonance signal received by the radio frequency coil; a coil movement unit which moves the radio frequency coil on the basis of the detected contour while the radio frequency coil is placed near and far relative to the object; and an image generation unit which generates a magnetic resonance image on the basis of the magnetic resonance signal received by the radio frequency coil that is moved by the coil movement unit.

According to third aspect of the present invention, there is provided a magnetic resonance imaging apparatus comprising: a static magnetic field generation unit which generates a static magnetic field in a gantry; a gradient magnetic field generation unit which applies a gradient magnetic field to a object in the static magnetic field; a radio frequency coil which receives a magnetic resonance signal from the object to which the gradient magnetic field is applied; a sensor which measures a thickness of the object; a coil movement unit which moves the radio frequency coil in a direction of the thickness on the basis of the detected thickness; and an image generation unit which generates a magnetic resonance image on the basis of the received magnetic resonance signal.

According to fourth aspect of the present invention, there is provided a magnetic resonance imaging apparatus comprising: a static magnetic field generation unit which generates a static magnetic field in a gantry; a gradient magnetic field generation unit which applies a gradient magnetic field to a object in the static magnetic field; a radio frequency coil which receives a magnetic resonance signal from the object to which the gradient-magnetic field is applied; a sensor which detects a proximity state between the radio frequency coil and the object; a coil movement unit which moves the radio frequency coil on the basis of the detected proximity state; and an image generation unit which generates a magnetic resonance image on the basis of the received magnetic resonance signal.

According to fifth aspect of the present invention, there is provided a magnetic resonance imaging apparatus comprising: a static magnetic field generation unit which generates a static magnetic field in a gantry; a gradient magnetic field generation unit which applies a gradient magnetic field to a object in the static magnetic field; a radio frequency coil which receives a magnetic resonance signal from the object to which the gradient magnetic field is applied; a top board on which the object is placed; a coil movement unit which moves the radio frequency coil on the basis of the detected contour while the radio frequency coil is placed near and far relative to the object; and an image generation unit which generates a magnetic resonance image on the basis of the received magnetic resonance signal.

According to sixth aspect of the present invention, there is provided an image generation method in magnetic resonance imaging apparatus comprising: a static magnetic field generation unit which generates a static magnetic field in a gantry; a gradient magnetic field generation unit which applies a gradient magnetic field to a object in the static magnetic field; a radio frequency coil which receives a magnetic resonance signal from the object to which the gradient magnetic field is applied, the image generation method comprising: detecting a contour of the object; moving the radio frequency coil on the basis of the detected contour while the radio frequency coil is placed near and far relative to the object; and generating a magnetic resonance image on the basis of the received magnetic resonance signal.

According to seventh aspect of the present invention, there is provided an image generation method in a magnetic resonance imaging apparatus comprising: a static magnetic field generation unit which generates a static magnetic field in a gantry; a gradient magnetic field generation unit which applies a gradient magnetic field to a object in the static magnetic field; and a radio frequency coil which receives a magnetic resonance signal from the object to which the gradient magnetic field is applied, the image generation method comprising: detecting a contour of the object on the basis of the magnetic resonance signal received by the radio frequency coil; moving the radio frequency coil on the basis of the detected contour while the radio frequency coil is placed near and far relative to the object; and generating a magnetic resonance image on the basis of the magnetic resonance signal received by the moved radio frequency coil.

According to eighth aspect of the present invention, there is provided an image generation method in a magnetic resonance imaging apparatus comprising: a static magnetic field generation unit which generates a static magnetic field in a gantry; a gradient magnetic field generation unit which applies a gradient magnetic field to a object in the static magnetic field; and a radio frequency coil which receives a magnetic resonance signal from the object to which the gradient magnetic field is applied, the image generation method comprising: measuring a thickness of the object; moving the radio frequency coil in a direction of the thickness on the basis of the measured thickness; and generating a magnetic resonance image on the basis of the received magnetic resonance signal.

According to ninth aspect of the present invention, there is provided an image generation method in a magnetic resonance imaging apparatus comprising: a static magnetic field generation unit which generates a static magnetic field in a gantry; a gradient magnetic field generation unit which applies a gradient magnetic field to a object in the static magnetic field; and a radio frequency coil which receives a magnetic resonance signal from the object to which the gradient magnetic field is applied, the image generation method comprising: detecting a proximity state between the radio frequency coil and the object; moving the radio frequency coil on the basis of the detected proximity state; and generating a magnetic resonance image on the basis of the received magnetic resonance signal.

According to tenth aspect of the present invention, there is provided an image generation method in a magnetic resonance imaging apparatus comprising: a static magnetic field generation unit which generates a static magnetic field in a gantry; a gradient magnetic field generation unit which applies a gradient magnetic field to a object in the static magnetic field; a radio frequency coil which receives a magnetic resonance signal from the object to which the gradient magnetic field is applied; and a top board on which the object is loaded, the image generation method comprising: moving the radio frequency coil on the basis of a position of the top board while the radio frequency coil is placed near and far relative to the object; and generating a magnetic resonance image on the basis of the detected magnetic resonance signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above.

FIG. 6 is a block diagram showing a configuration of an magnetic resonance imaging apparatus according to a second embodiment of the invention;

FIGS. 13A and 13B are diagrams showing another configuration of the controller 60 in FIG. 10; and FIG. 14 is a diagram showing another configuration of the controller 60 in FIG. 10.

DETAILED DESCRIPTION OF THE INVENTION

Referring to the accompanying drawings, embodiments of the invention will be described below.

(First Embodiment)

Figure 1:
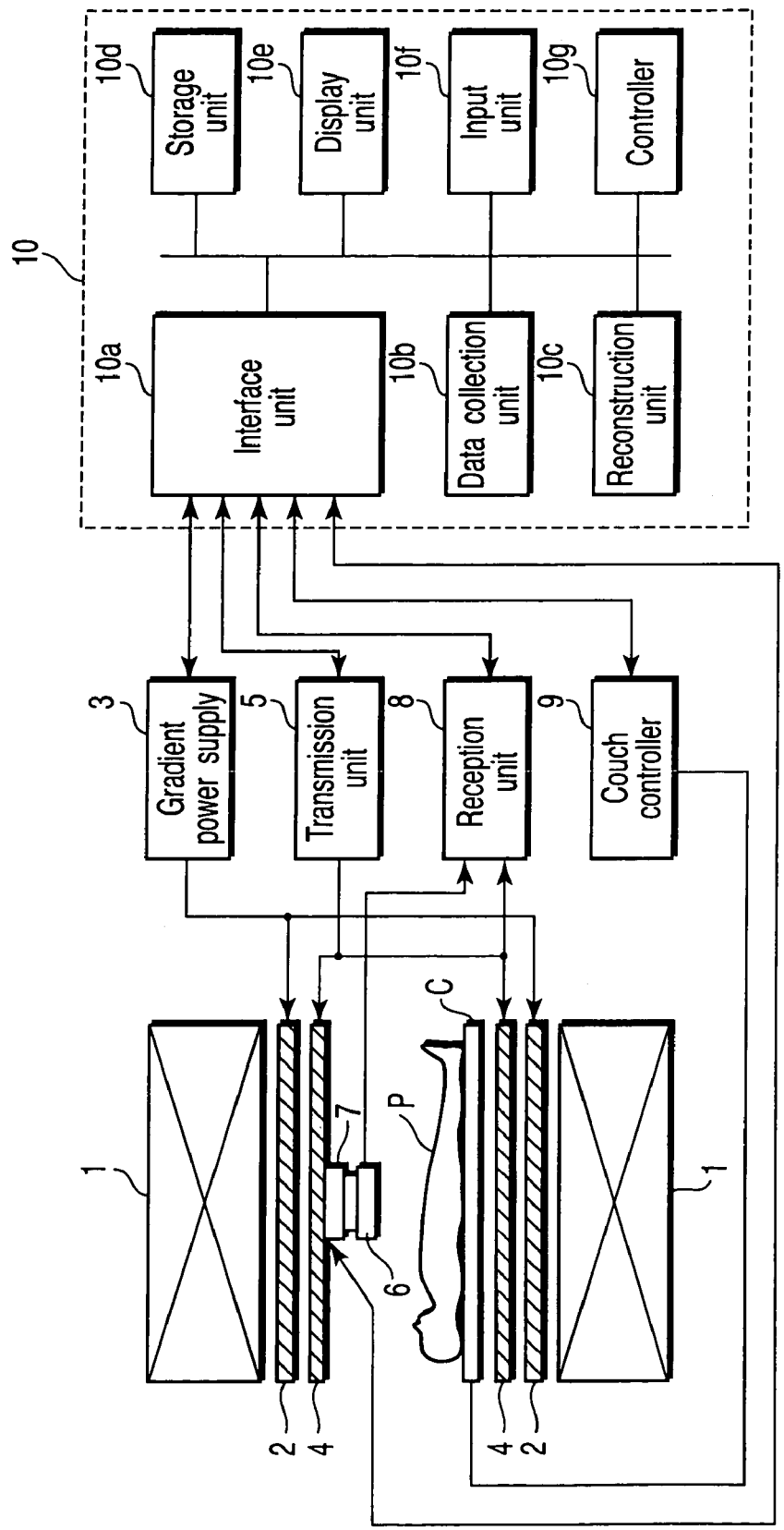
FIG. 1 is a diagram showing a configuration of a magnetic resonance imaging apparatus according to a first embodiment of the invention.

FIG. 1 is a diagram showing a configuration of an MRI apparatus according to a first embodiment of the invention. The MRI apparatus shown in FIG. 1 includes a static field magnet 1, a gradient magnetic field coil 2, a gradient power supply 3, a radio frequency coil 4, a transmission unit 5, a local probe 6, a position adjustment mechanism 7, a reception unit 8, a couch controller 9, and a computer system 10.

The static field magnet 1 has a hollow cylindrical shape and generates a uniform static magnetic field in an inside space. For example, a permanent magnet, a superconducting magnet, and the like are used as the static field magnet 1.

The gradient magnetic field coil 2 has a hollow cylindrical shape and is arranged inside the static field magnet 1. Three coils corresponding to axes X, Y, and Z orthogonal to one another are combined in the gradient magnetic field coil 2. In the gradient magnetic field coil 2, the gradient power supply 3 separately supplies current to the three coils to generate a gradient magnetic field whose magnetic field intensity is declined along each of the axes X, Y, and Z. The Z-axis direction is equal to the direction of the static magnetic field. The gradient magnetic fields of the axes X, Y, and Z correspond to a slice selection gradient magnetic field Gs, a phase encode gradient magnetic field Ge, and a readout gradient magnetic field Gr, respectively. The slice selection gradient magnetic field Gs is utilized to arbitrarily determine a photographic section. The phase encode gradient magnetic field Ge is utilized to encode the phase of a magnetic resonance signal in accordance with a spatial position. The readout gradient magnetic field Gr is utilized to encode the frequency of the magnetic resonance signal in accordance with the spatial position.

The radio frequency coil 4 has a hollow cylindrical shape and is arranged inside the gradient magnetic field coil 2. A patient P loaded on a couch C is inserted into the inside of the radio frequency coil 4. The radio frequency coil 4 generates a radio frequency magnetic field by receiving radio frequency pulses supplied from the transmission unit 5. The radio frequency coil 4 also receives the magnetic resonance signal radiated from the patient P by influence of the radio frequency magnetic field. The radio frequency coil 4 has an inner diameter through which the patient P easily passes, and therefore, the radio frequency coil 4 functions as a whole body RF probe.

The transmission unit 5 includes an oscillation unit, a phase selection unit, a frequency modulation unit, an amplitude modulation unit, and a radio frequency power amplification unit. The oscillation unit generates a radio frequency signal of an intrinsic resonance frequency in a subject atomic nucleus in the static magnetic field. The phase selection unit selects the phase of the radio frequency signal. The frequency modulation unit modulates the frequency of the radio frequency signal outputted from the phase selection unit. The amplitude modulation unit modulates amplitude of the radio frequency signal outputted from the frequency modulation unit in accordance with, for example, a sync function. The radio frequency power amplification unit amplifies the radio frequency signal outputted from the amplitude modulation unit. As a result of the operation of each unit, the transmission unit 5 transmits the radio frequency pulse corresponding to a Larmor frequency to the radio frequency coil 4.

A radio frequency coil which is smaller than the radio frequency coil 4 is incorporated into the local probe 6. The local probe 6 is arranged inside the radio frequency coil 4 and supported by the position adjustment mechanism 7. The radio frequency coil incorporated into the local probe 6 receives the magnetic resonance signal radiated from the patient P.

Figure 2:
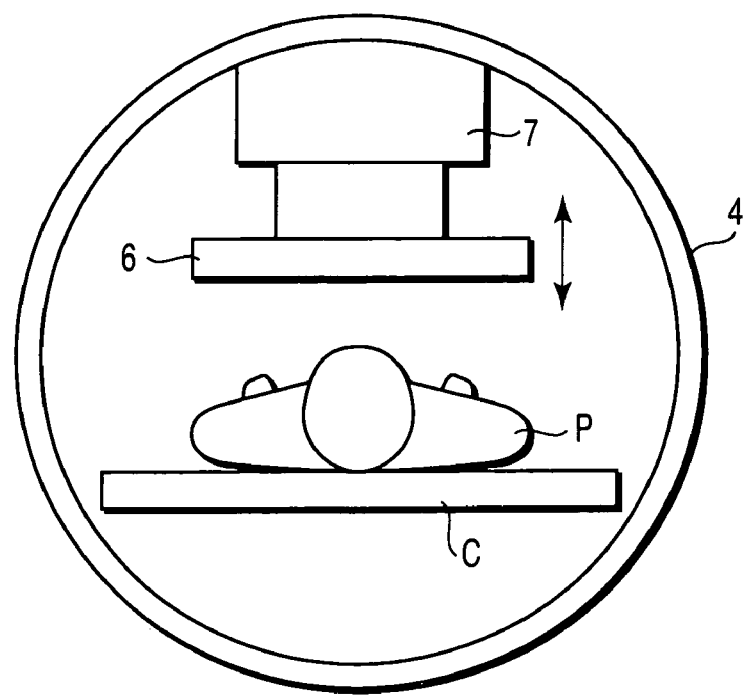
FIG. 2 is a view showing an appearance of a radio frequency coil 4 of FIG. 1 and an inside of the radio frequency coil 4 when viewed from a left side of FIG. 1.

FIG. 2 shows an appearance of the radio frequency coil 4 and the inside of the radio frequency coil 4 when viewed from a left side of FIG. 1. As shown in FIGS. 1 and 2, the position adjustment mechanism 7 is arranged inside the radio frequency coil 4 and fixed to a top surface of the radio frequency coil 4. Instead of the direct fixation of the position adjustment mechanism 7 to the radio frequency coil 4, it is also possible that the position adjustment mechanism 7 is supported inside the radio frequency coil 4 by various methods. As shown by an arrow in FIG. 2, the position adjustment mechanism 7 moves the local probe 6 in a vertical direction.

The reception unit 8 includes a selector, a preamplifier, a phase detector, and an analog/digital converter. The selector selectively inputs the magnetic resonance signals outputted from the radio frequency coil 4 and the local probe 6. The reception unit 8 amplifies the magnetic resonance signal outputted from the selector. The phase detector detects the phase of the magnetic resonance signal outputted from the preamplifier. The analog/digital converter converts a signal outputted from the phase detector into a digital signal.

The couch controller 9 includes a moving mechanism unit and a movement controller. The moving mechanism unit reciprocally moves the couch C in an axial direction of the radio frequency coil 4, i.e. a horizontal direction in FIG. 6. The movement controller controls the moving mechanism unit so as to move in a forward direction and a reverse direction.

The computer system 10 includes an interface unit 10a, a data collection unit 10b, a reconstruction unit 10c, a storage unit 10d, a display unit 10e, an input unit 10f, and a controller 10g.

The interface unit 10a is connected to the gradient power supply 3, the transmission unit 5, the position adjustment mechanism 7, the reception unit 8, and the couch controller 9. The interface unit 10a inputs and outputs the signal transmitted and received between the computer system 10 and these connected units.

The data collection unit 10b collects a digital signal outputted from the reception unit 8 though the interface unit 10a. The data collection unit 10b stores the collected digital signal, i.e. the magnetic resonance signal data in the storage unit 10d.

The reconstruction unit 10c determines spectrum data or image data of the desired nuclear spin in the patient P by performing post-processing, i.e. the reconstruction such as Fourier transformation to the magnetic resonance signal data stored in the storage unit 10d.

The magnetic resonance signal data and the spectrum data or the image data are stored on a patient-by-patient basis in the storage unit 10*d*.

The display unit 10*e* displays various pieces of information such as the spectrum data or the image data under the control of the controller 10*g*. Display devices such as a liquid crystal display device can be used as the display unit 10*e*.

The input unit 10*f* receives various direction or information input from an operator. Pointing devices such as a mouse and a track ball, selection devices such as a mode switching device, or input devices such as a keyboard can be appropriately used as the input unit 10*f*.

The controller 10*g* includes a CPU, a memory and the like. The controller 10*g* performs centralized control of the above-described units. The controller 10*g* also detects a contour of the patient P on the basis of the image data reconstructed in accordance with the magnetic resonance signal outputted from the radio frequency coil 4. Further, the controller 10*g* compensates a change in interval between the surface of the patient 6 and the local probe 6 caused by the movement of the patient P, which allows the position adjustment mechanism 7 to be controlled so that the local probe 6 is maintained in the state in which the local probe 6 is located in the proximity of the surface of the patient P.

The operation of the MRI apparatus having the above-described configuration will be described below.

When the image of the whole body of the patient P is imaged, the couch C is drawn from the radio frequency coil 4 to load the patient P. Then, the operator operates the input unit 10*f* to instruct the start of the imaging of the whole body.

Figure 3:
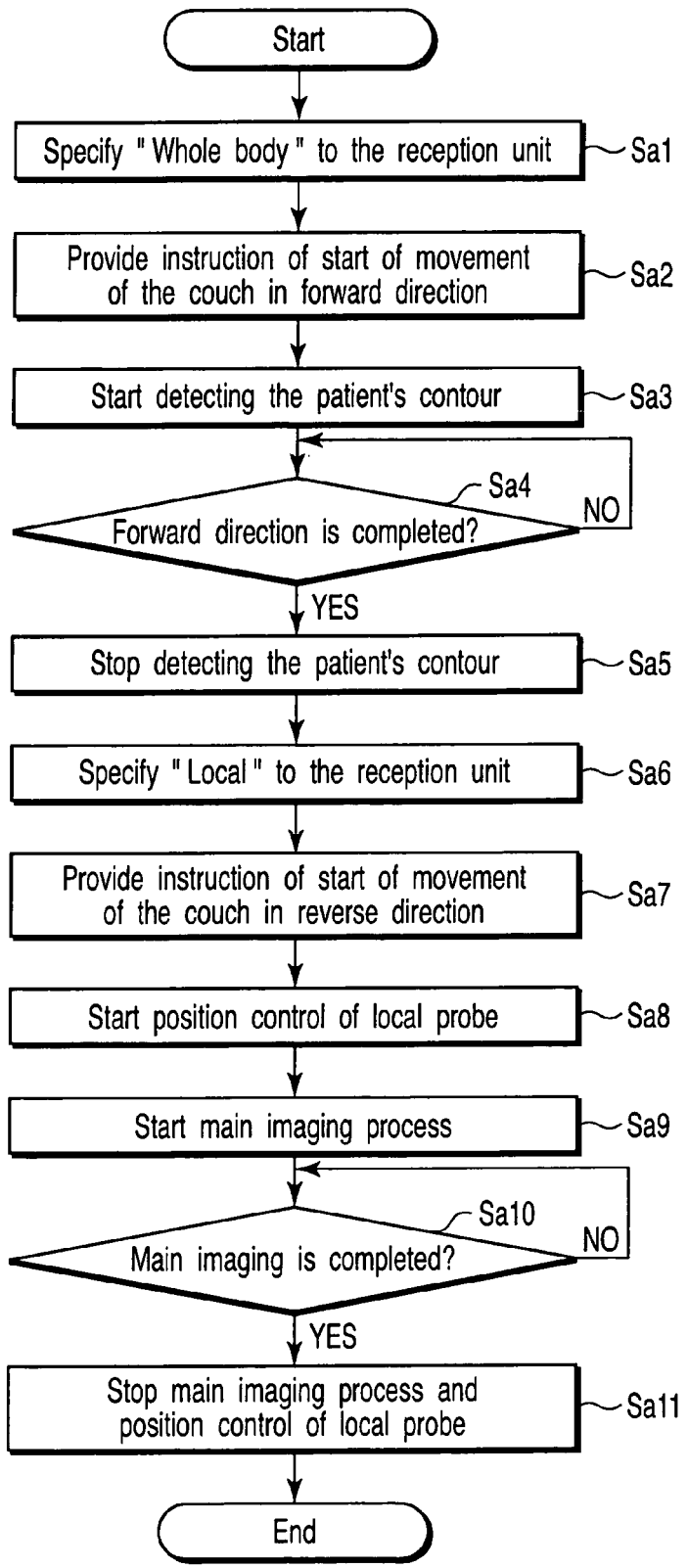
FIG. 3 is a flow chart showing a procedure of a controller 10$g$.

The instruction is transferred from the input unit 10*f* to the controller 10g. When the controller 10*g* receives the instruction, the controller 10*g* starts the process shown in a flow chart of FIG. 3.

In Step Sa1, the controller 10*a* specifies "Whole body" to the reception unit 8. When the reception unit 8 receives the specification, the reception unit 8 can input the magnetic resonance signal outputted from the radio frequency coil 4. In Step Sa2, the controller 10*g* instructs the couch controller 9 to start the movement of the couch C in the forward direction. When the couch controller 9 receives the instruction, the couch controller 9 moves the couch C in the forward direction (for example, a leftward direction in FIG. 1). It is possible that the couch controller 9 moves the couch C at a constant velocity, or it is possible that the couch controller 9 intermittently moves the couch C in each one pitch. In Step Sa3, the controller 10*g* starts the contour detection.

The contour detection is a process for detecting the contour of the patient. Specifically, the contour is detected by determining a sectional shape of the patient on the basis of the magnetic resonance signal data outputted from the reception unit 8, i.e. the magnetic resonance signal data which is generated by the reception unit 8 from the magnetic resonance signal received by the radio frequency coil 4. The contour is detected at each predetermined position of the couch C. In Step Sa4, the controller 10*g* waits for completion of the movement in the forward direction while performing the contour detection.

When the couch C is moved to a terminal of a predetermined movement range, the couch controller 9 stops the movement in the forward direction to notify the controller 10*g* of the completion of the movement in the forward direction. When the controller 10*g* receives the notification, the controller 10*g* proceeds from Step Sa4 to Step Sa5. In Step Sa5, the controller 10*g* finishes the contour detection.

In Step Sa6, the controller 10*g* specifies "Local" to the reception unit 8. When the reception unit 8 receives the specification, the reception unit 8 can input the magnetic resonance signal outputted from the local probe 6. In Step Sa7, the controller 10*g* instructs the couch controller 9 to start the movement of the couch C in the reverse instruction. When the couch controller 9 receives the direction, the couch controller 9 moves the couch C in the reverse direction (for example, a rightward direction in FIG. 1). In Step Sa8, the controller 10*g* starts the position control of the local probe 6.

The position control is a process for adjusting the position of the local probe 6 so as to maintain the state in which the patient P and the local probe 6 are close to each other without interference. Namely, when a region of the patient P opposite to the local probe 6 is changed in accordance with the movement of the patient P, the interval between the patient P and the local probe 6 is changed. Therefore, the position of the local probe 6 is adjusted so that the change in interval is compensated. Specifically, the controller 10*g* synchronizes with the movement of the couch C to drive the position adjustment mechanism 7 while referring to the contour detected in the contour detection.

Figure 4A:
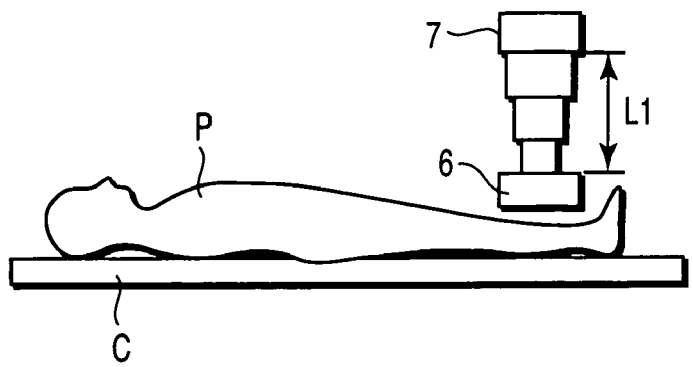
FIGS. 4A, 4B and 4C are views showing an example of a change in position on a local probe 6 under position control.
Figure 4B:
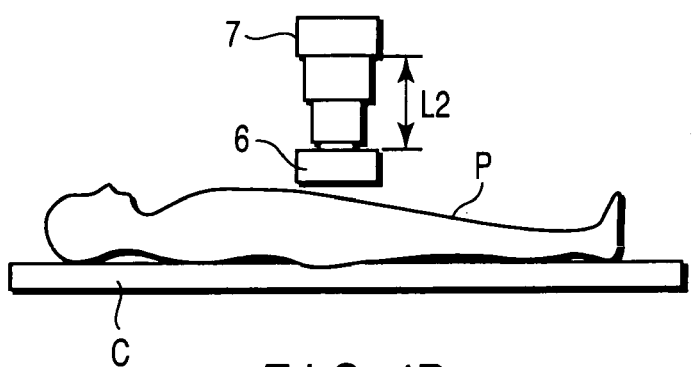
Figure 4C:
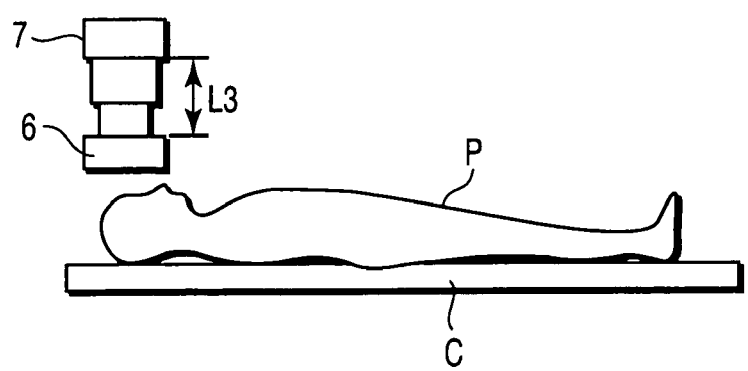

FIGS. 4A, 4B and 4C are views showing an example of the change in position of the local probe 6 under the position control. As shown in FIGS. 4*a*, 4B and 4C, the intervals from a base portion of the position adjustment mechanism 7 to the local probe 6 are set to L1, L2 and L3 in accordance with the height of the region opposite to the local probe 6, respectively.

After the movement of the couch C in the reverse direction and the position control of the local probe 6 are started, the controller 10*g* starts a main imaging process in Step Sa9. The main imaging process is a process for determining the spectrum data or the image data concerning the whole of the patient P. Specifically, the main imaging process is performed on the basis of the magnetic resonance signal data outputted from the reception unit 8, i.e. the magnetic resonance signal data which is generated by the reception unit 8 from the magnetic resonance signal received by the local probe 6. The controller 10*g* periodically performs the process for determining the local spectrum data or the local image data concerning the patient P on the basis of the magnetic resonance signal data while synchronizing with the movement of the couch C. The controller 10*g* determines the spectrum data or the image data concerning the whole of the patient P by collecting the local spectrum data or the local image data.

In Step Sa10, the controller 10*g* waits for the completion of the imaging of the whole of the patient P while performing the main imaging process. When the imaging of the whole of the patient P is completed, the controller 10*g* proceeds from Step Sa10 to Step Sa11. In Step Sa11, while the controller 10*g* stops the main imaging process, the controller 10*g* stops the position control of the local probe 6. Then, the controller 10*g* ends the processes shown in FIG. 3.

As described above, in accordance with the first embodiment, the contour of the patient P is detected by using the radio frequency coil 4 which is of the whole body probe. Then, the image of the whole body of the patient P is imaged with the local probe 6 by referring to the detected contour while maintaining the state in which the local probe 6 is located in the proximity of the patient P. As a result, the imaging can be performed with high quality by sufficiently using the characteristics of the local probe 6. Since the local probe 6 is not attached to the patient P, an additional burden is not placed on the patient P. Further, since both the contour detection and the main imaging are performed during the reciprocal movement of the couch C, the imaging can be efficiently performed in a short time.

The following various modifications can be made in the first embodiment.

It is also possible that the configuration adopts a cross-coil method in which the radio frequency coil 4 is dedicated solely to the reception and a transmission radio frequency coil is separately provided.

Figure 5:
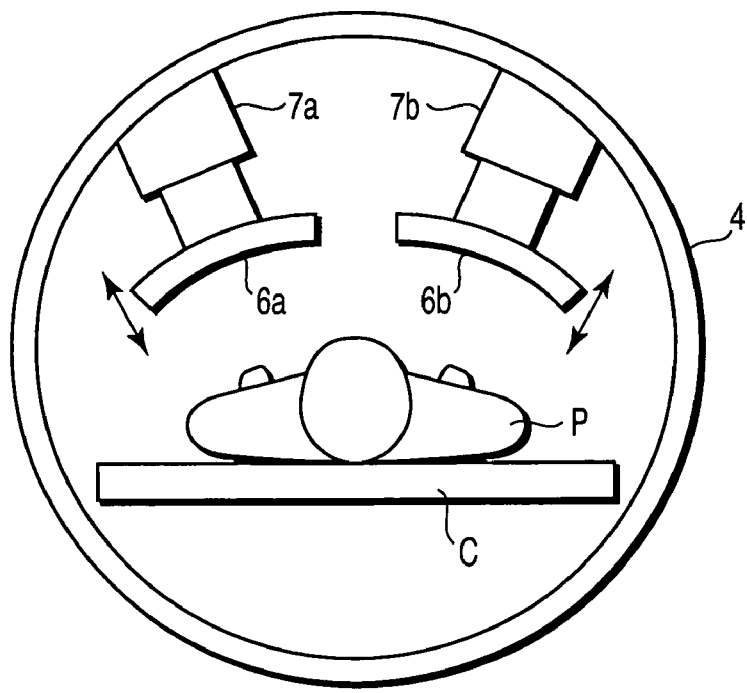
FIG. 5 is a view showing a modification of an arrangement of the local probe and a position adjustment mechanism.

As shown in FIG. 5, it is also possible that the positions of local probes 6a and 6b is separately adjusted by preparing position adjustment mechanisms 7a and 7b instead of the position adjustment mechanism 7 while the local probes 6a and 6b are provided instead of the local probe 6.

Although the imaging of the whole body is described in the first embodiment, the invention can be applied to not only the imaging of the whole body but also the imaging in the wide range accompanied by the movement of the patient P. Further, the invention can be applied to the case of the imaging for the plurality of regions of the patient P separated from one another, so that the imaging can be performed only by moving the patient P.

(Second Embodiment)

FIG. 6 is a block diagram showing a configuration of an MRI apparatus according to a second embodiment of the invention. FIG. 7 and FIGS. 8A, 8B and 8C are views showing a configuration of a moving mechanism of a reception coil in FIG. 6. For the sake of convenience of the description, the axial directions X, Y, and Z are defined as shown in the drawings.

As shown in FIG. 6, the MRI apparatus of the second embodiment includes a gantry 21, a couch 22, a static field magnet 23, a gradient magnetic field coil 24, a radio frequency coil 25, reception coils 26a, 26b, 26c and 26d, a first moving mechanism 27, a second moving mechanism 28, a distance measuring sensor 29, a sensor controller 30, a gradient magnetic field drive unit 31, a transmission unit 32, a moving mechanism controller 33, a reception unit 34, a data collection unit 35, a computer 36, a console 37, a display 38, and a sequence controller 39.

In FIG. 6, the gantry 21 shows a cross section taken on a Y-Z plane. The static field magnet 23, the gradient magnetic field coil 24, the radio frequency coil 25, the reception coils 26a, 26b, 26c and 26d, the first moving mechanism 27, the second moving mechanism 28, and the distance measuring sensor 29 are provided in the gantry 21.

The couch 22 conveys the patient P into the gantry 21.

The static field magnet 23 is provided in the gantry 21, and applies the uniform static magnetic field to the patient P. The gradient magnetic field coil 24 applies the gradient magnetic field to the patient P. The radio frequency coil 25 applies the radio frequency magnetic field to the patient P. The reception coils 26a to 26d receive the magnetic resonance signal radiated from the patient P.

The first moving mechanism 27 moves the reception coil 26a in the Y direction. The second moving mechanism 28 moves the reception coil 26a in the X direction. The distance measuring sensor 29 measures a body thickness of the patient P.

The sensor controller 30 controls the distance measuring sensor 29 so that the body thickness is measured in synchronization with the conveyance of the patient P into the gantry 21. The gradient magnetic field drive unit 31 drives the gradient magnetic field coil 24. The transmission unit 32 applies the radio frequency pulse to the radio frequency coil 25. The moving mechanism controller 33 controls the operations of the first moving mechanism 27 and the second moving mechanism 28. The reception unit 34 amplifies and detects the magnetic resonance signal received by the reception coils 26a to 26d. The data collection unit 35 performs A/D conversion of the magnetic resonance signal outputted from the reception unit 34 to collect the magnetic resonance signal. The computer 36 performs an image reconstruction process on the basis of the magnetic resonance signal outputted from the data collection unit 35. The console 37 captures the information inputted to the computer 36 by the operator. The display 38 performs various information displays under the control of the computer 36. The sequence controller 39 controls the gradient magnetic field drive unit 31, the transmission unit 32, the moving mechanism controller 33, the reception unit 34, the data collection unit 35, and the computer 36.

The reception coil 26a is arranged on the upper side, and the reception coils 26b to 26d are arranged on the lower side. In the second embodiment, when a plurality of reception coil are provided, like the reception coil 26a, at least one reception coil is arranged on the upper side, and the remains are arranged on the lower side. A wide imaging region can be obtained by detecting the signal with a pair of the coil arranged on upper side and the coils arranged on the lower side. The number of coils arranged on the lower side can be determined in accordance with the area of the necessary imaging region. During the imaging, the reception coil 26a is arranged in the center of the imaging region. The reception coil 26a is vertically moved in accordance with a body thickness of the patient P under the control of the moving mechanism controller 33. When the imaging range in the Z direction is specified by an imaging region specifying method described later, the reception coils 26b to 26d are sequentially moved below the reception coil 26a in accordance with the specification of the imaging range in the Z direction.

An inner space of the gantry 21 is referred to as bore. An opening 21a for loading and unloading a top board 22a of the couch 22 on which the patient P is placed is provided in the gantry 21. The second moving mechanism 28 is provided in the upper surface portion of an inner wall of the bore.

Holding means (described later) connected to a backside of a reception surface (opposite surface to the patient P) of the reception coil 26a is connected to one end of the first moving mechanism 27. The other end of the first moving mechanism 27 is attached to the second moving mechanism 28.

Figure 7:
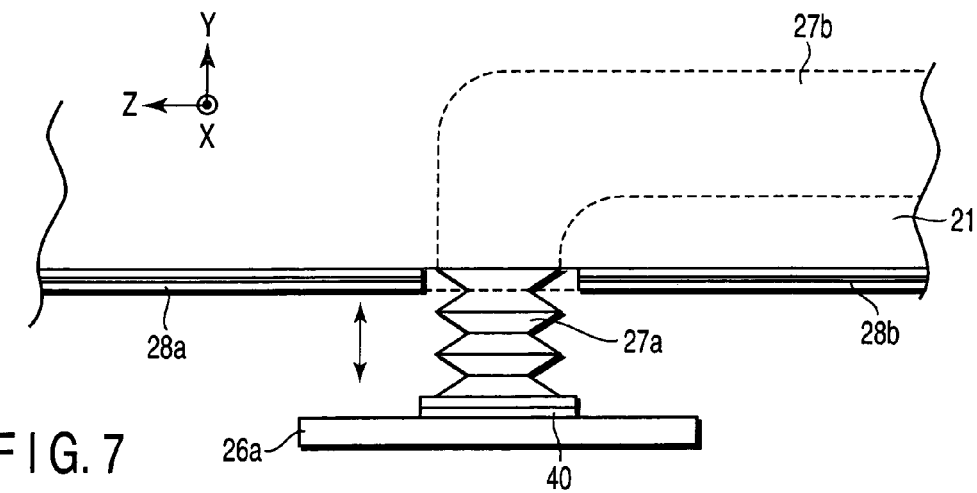
FIG. 7 is a view showing a configuration of a moving mechanism of a reception coil in FIG. 6.

As shown in FIG. 7, the first moving mechanism 27 includes a bellows mechanism 27a. The first moving mechanism 27 also includes a compressor. When the compressor feeds air to the bellows mechanism 27a through an inflow pipe 27b arranged in the gantry 21, or when the compressor sucks the air from the bellows mechanism 27a, the bellows mechanism 27a is expanded or compressed. The bellows mechanism 27a is arranged so that an expansion direction of the bellows mechanism 27a is orientated toward the Y direction. The data indicating a correlation between displacement in the Y direction of the first moving mechanism 27 and a pressure value in the bellows mechanism 27a is stored in the data collection unit 35. The sequence controller 39 refers to the data and determines the pressure in the bellows mechanism 27a in accordance with the necessary displacement.

The second moving mechanism 28 includes a rail 28a. In the rail 28a, a groove 28b is formed in the Z direction. When a holding member 40 formed in a rectangle engages the groove 28b, the rail 28a can guide the reception coil 26a to move the reception coil 26a in the Z direction. This is a mechanism for changing the imaging position in the bore. The holding member 40 has a structure in which the engagement with the groove 28b is released when the reception coil 26a is moved in the Y direction by the first moving mechanism 27.

The second moving mechanism 28 includes power source for moving the reception coil 26a in the Z direction as described above. It is possible that a motor is provided as the power source on the side of the first moving mechanism 27, or it is possible to provide a mechanism in which the reception coil 26a is moved by the motor arranged at a distance from the first moving mechanism 27 through a traction string.

The distance measuring sensor 29 is arranged in the upper portion of the opening 21a. For example, it is desirable to apply a sensor which measures the distance by using a distance measuring laser or an ultrasonic wave to be reflected from the top board 22a or a body surface of the patient P.

The operation of the MRI apparatus of the second embodiment having the above-described configuration will be described below.

In order to perform the imaging, the patient P placed on the couch 22 is loaded into the gantry 21. This can be achieved in such a manner that the couch 22 moves the top board 22a in the Z direction at a constant velocity. At this point, the operator presses a distance measurement start button provided in the console 37 to transmit a start signal to the sequence controller 39, when the imaging region of the patient P is located immediately below the distance measuring sensor 29. Then, the operator presses a distance measurement end button provided in the console 37 to transmit an end signal to the sequence controller 39, when the imaging region of the patient P finishes passing through immediately below the distance measuring sensor 29. Therefore, it is convenient that the distance measurement start button and the distance measurement end button are attached on the side face of the gantry 21.

When the start signal is transmitted to the sequence controller 39, the sequence controller 39 instructs the sensor controller 30 to start the measurement of the body thickness. When the end signal is transmitted to the sequence controller 39, the sequence controller 39 instructs the sensor controller 30 to finish the measurement of the body thickness. After the start instruction is provided, the sensor controller 30 causes the distance measuring sensor 29 to measure the body thickness of the patient P until the finish instruction is provided. The distance measuring sensor 29 transmits the information obtained by the measurement to the sequence controller 39 through the sensor controller 30.

The static field magnet 23 applies the uniform static magnetic field to the patient P conveyed in the bore. At this point, the orientation of the applied static magnetic field is set to the Z direction.

Figure 8A:
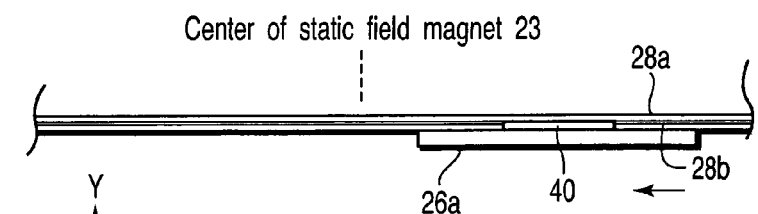
FIGS. 8A, 8B and 8C are views showing the moving mechanism of the reception coil in FIG. 6.
Figure 8B:
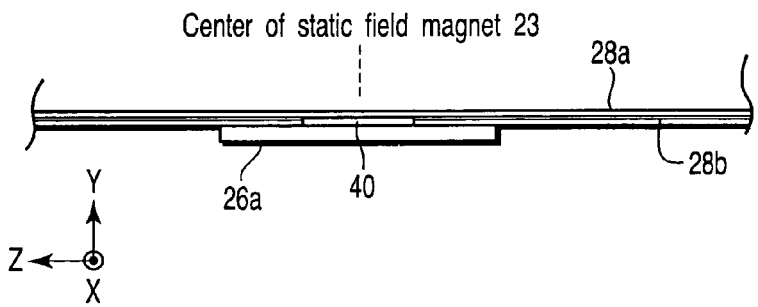
Figure 8C:
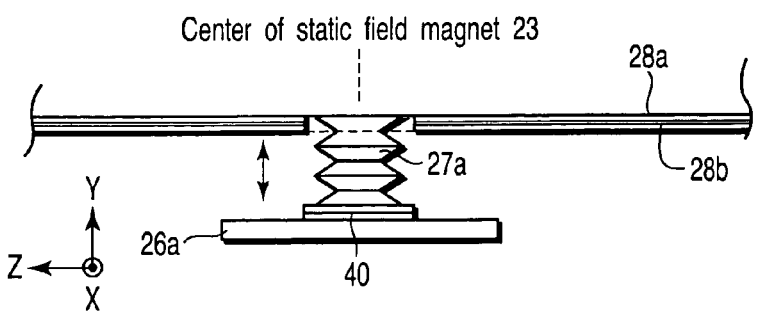

As shown in FIG. 8B, the moving mechanism controller 33 causes the second moving mechanism 28 to move the reception coil 26a from the position shown in FIG. 8A to the center of the static field magnet 23. Then, the couch 22 is moved so that the reception coil on which the region of the patient P corresponding to a start point of the imaging region is placed is located below the reception coil 23. In this case, the description will be given by assuming that the start point of the imaging region is set to the head side end of the reception coil 26b and a finish point of the imaging region is set to the foot side end of the reception coil 26d. Namely, the couch 22 is moved so that the reception coil 26b is first located below the reception coil 26a.

Then, the moving mechanism controller 33 releases the engagement between the holding member 40 and the groove 28b. As shown in FIG. 8, the moving mechanism controller 33 adjusts the position of the reception coil 26a in the Y direction to make the reception surface of the reception coil 26a close to the body surface of the patient P by feeding/sucking the air into/from the bellows mechanism 27a on the basis of the information concerning the displacement in the Y direction, which is transmitted from the sequence controller 39.

Then, the gradient magnetic field drive unit 31 drives the gradient magnetic field coil 24 under the control of the sequence controller 39, and the gradient magnetic field coil 24 applies gradient magnetic fields Gx, Gy, and Gz in which the magnetic field intensity is linearly changed in the directions X, Y, and Z respectively to the patient P. The transmission unit 32 applies the radio frequency pulse to the radio frequency coil 8 under the control of the sequence controller 39, and the radio frequency coil 8 applies the radio frequency magnetic field to the patient P. The magnetic resonance signal is received by utilizing the reception coil 26a and the reception coil 26b.

Then, the sequence controller 39 transmits the information concerning the displacement of the first moving mechanism 27 to the moving mechanism controller 33 to instruct the moving mechanism controller 33 to move the reception coil 26a.

The reception coil 26c is located below the reception coil 26a by moving the couch 22. In this state, similarly the magnetic resonance signal is received by utilizing the reception coil 26a and the reception coil 26c. Then, the reception coil 26d is located below the reception coil 26a. In this state, similarly the magnetic resonance signal is received by utilizing the reception coil 26a and the reception coil 26d. Therefore, the magnetic resonance signals over the wide region from the reception coil 26b to the reception coil 26d can be acquired. Since the reception coil 26a is vertically moved in accordance with the body thickness of the patient P at each position of the reception coils 26b to 26d, the reception coil 26a is brought close to the patient P and the good magnetic resonance signal can be obtained at any position.

After the magnetic resonance signals received by the reception coils 26a to 26d, respectively, are amplified and detected to perform the A/D conversion by the reception unit 34, the magnetic resonance signals are transmitted to the data collection unit 35 under the control of the sequence controller 39. The data collection unit 35 collects the magnetic resonance signal under the control of the sequence controller 39, and the magnetic resonance signal is stored in the data collection unit 35. The data collection unit 35 transmits the stored magnetic resonance signal to the computer 36 under the control of the sequence controller 39. The computer 36 reconstructs the image on the basis of the magnetic resonance signal transmitted from the data collection unit 35 under the control of the sequence controller 39. The image reconstructed by the computer 36 is displayed on the display 38.

The following various modifications can be made in the second embodiment.

In the specific example described above, although the end portion of the region desired to be imaged corresponds to the coil ends of the reception coils 26b to 26d, sometimes the end portion of the imaging region does not correspond to the coil ends of the reception coils 26b to 26d. In such cases, for example, when imaging across both the reception coils 26*b* and 26*c* relative to the reception coil 26*a*, it is possible that the magnetic resonance signal is received by utilizing the reception coils 26*a*, 26*b* and 26*c*. When the reception coils 26*b* to 26*d* are previously fixed to the couch 22, it is possible to properly plan how to collect the image data by dividing the image data into how many times with what combination of the reception coils 26*b* to 26*d* at the time when the imaging start point and the imaging finish point are specified.

It is also possible to omit the second moving mechanism 28. In this case, the reception coil 26*a* is fixed in the Z direction. When the start signal is transmitted to the distance measuring sensor 29, the imaging region of the patient P is specified on the couch 22. Then, the displacement in the Z direction of the couch 22 may be controlled so that the imaging region is located immediately below the reception coil 26*a*.

Figure 9:
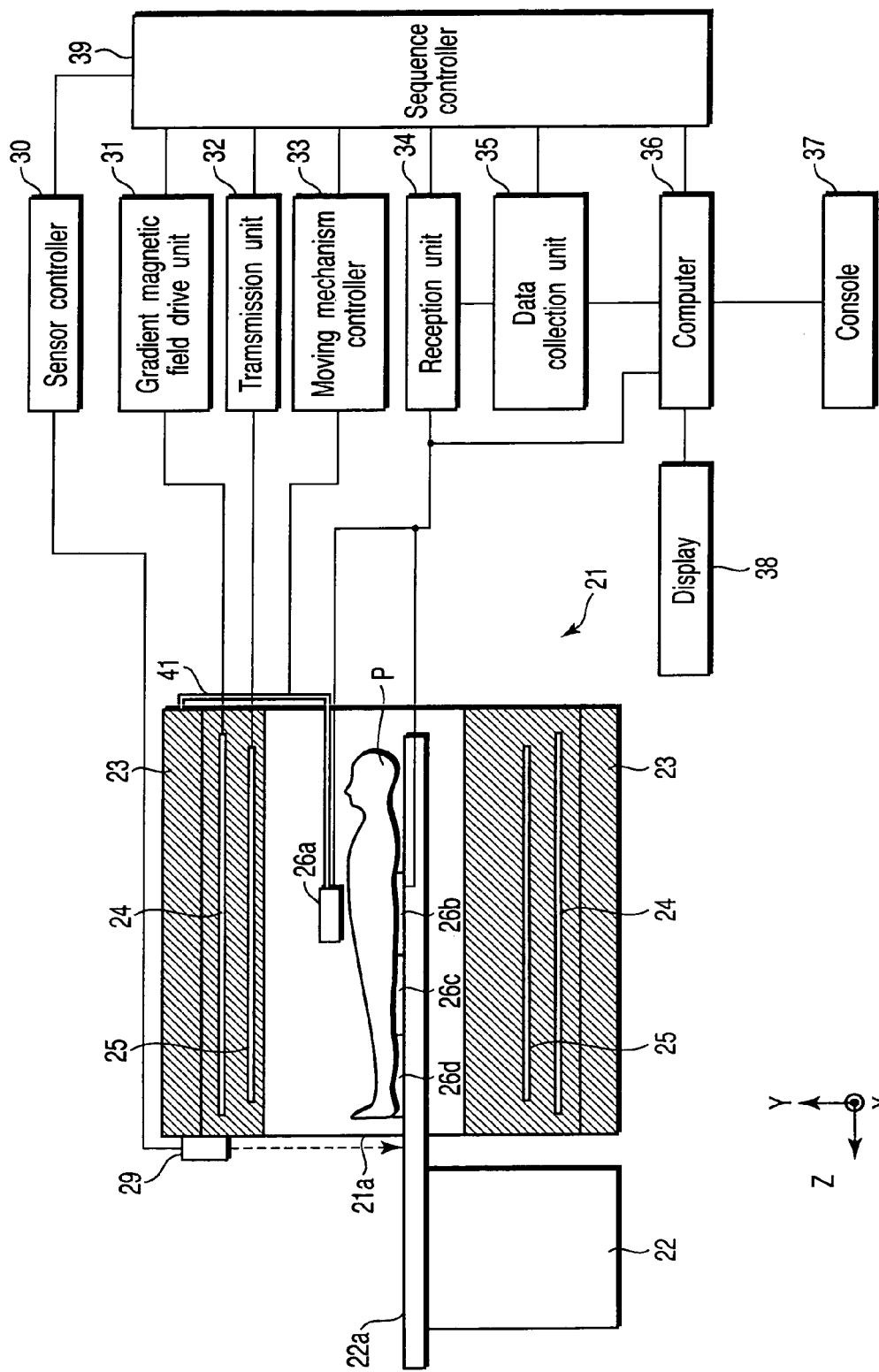
FIG. 9 is a diagram showing a configuration of a modification of the moving mechanism of the reception coil.

It is also possible that the configuration shown in FIG. 9 is formed by modifying the second embodiment. Namely, the mechanism which moves the reception coil 26*a* in the gantry 21 is changed to a mechanism which uses an L-shaped supporting member 41. The reception coil 26*a* is attached to one end of the supporting member 41, and the other end of the supporting member 41 is attached to the outside of the gantry 21. The supporting member 41 is moved by power source provided on the side of the gantry 21 to move the reception coil 26*a*.

It is also possible that the reception coil 26*a* is detachably formed so that the operator uses the reception coil like the probe. It is also possible that each of the reception coils 26*a* to 26*d* is formed in an array coil having a plurality of coils in one unit.

It is also possible that the couch 22 includes a third moving mechanism which vertically moves the top board 22*a*. When the patient P is small, or when the body thickness is small, it is necessary to largely move the reception coil 26*a* relative to the patient P. Consequently, the imaging region is excessively lowered from the center of the magnet which is the preferable region of the magnetic field magnet, which decreases the sensitivity. However, when the third moving mechanism is utilized, the amount of movement of the reception coil 26*a* can be suppressed to the small amount, and the above-described drawback can be solved.

It is also possible that the magnetic resonance signal is received only by the reception coil 26*a* without utilizing the reception coils 26*b* to 26*d*.

It is possible that the distance measuring sensor 29 is attached to the reception coil 26*a*. In this case, the top board 22*a* is moved first so that the imaging region of the patient P is opposed to the reception coil 26*a*. The distance from the reception coil 26*a* to the patient P is measured by the distance measuring sensor 29. Then, the reception coil 26*a* can be vertically moved on the basis of the measurement result. In this case, it should be sufficiently considered that an attachment position of the distance measuring sensor 29 is determined so that the reception sensitivity of the reception coil 26*a* is not decreased. It is desirable that the distance measuring sensor 29 is shielded with a radio shield material such as aluminum. It is desirable that distance-measurement timing with the distance measuring sensor 29 is set in a period when the pulse sequence for the imaging is not executed or out of a period of signal reception.

(Third Embodiment)

Figure 10:
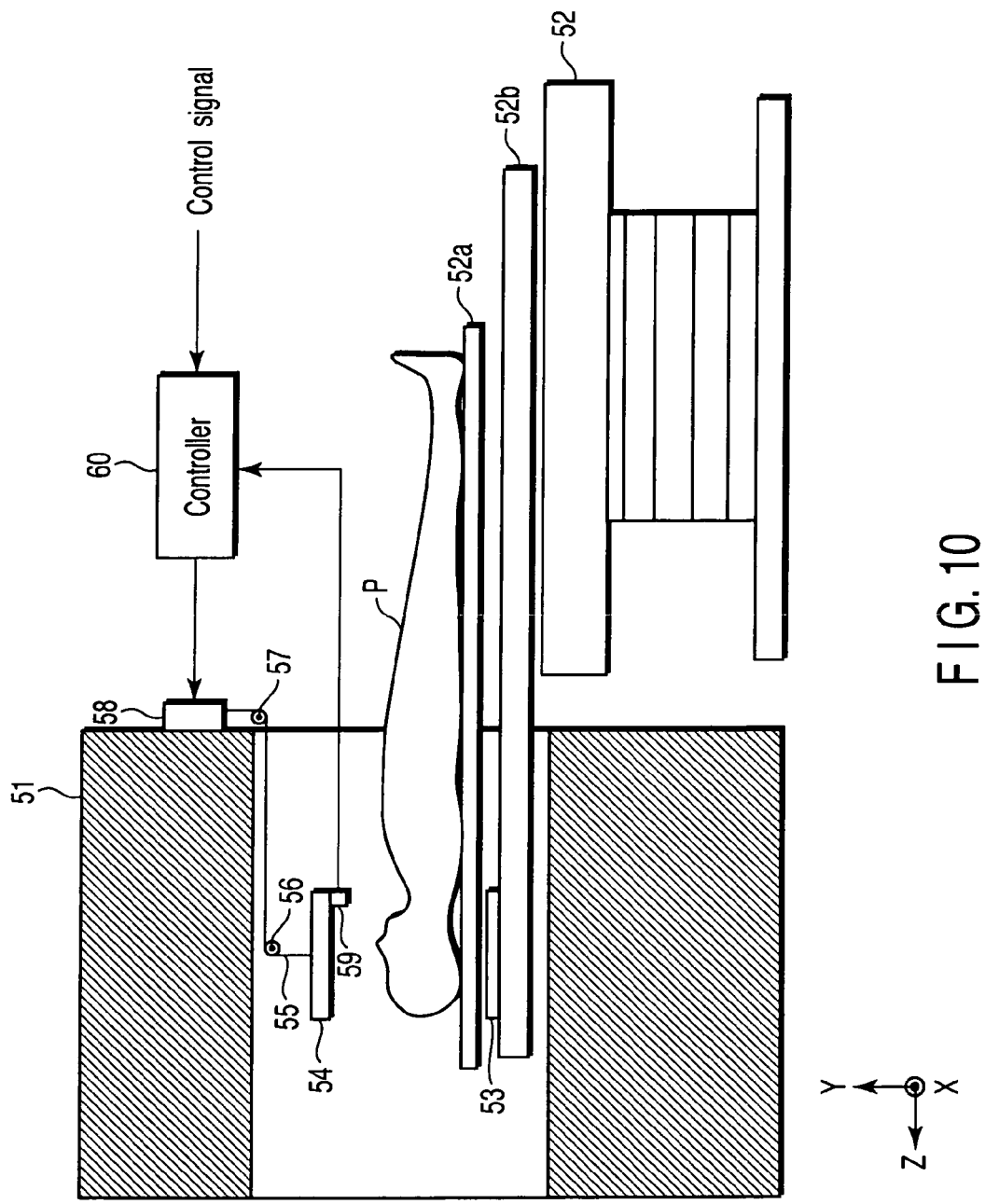
FIG. 10 is a diagram showing a configuration of an magnetic resonance imaging apparatus according to a third embodiment of the invention.

FIG. 10 is a diagram showing a configuration of an MRI apparatus according to a third embodiment of the invention. For the sake of convenience of the description, the axial directions X, Y, and Z are defined as shown in FIG. 10.

As shown in FIG. 10, the MRI apparatus of the third embodiment includes a gantry 51, a couch 52, reception coils 53 and 54, a wire 55, pulleys 56 and 57, a hoisting device 58, a sensor 59, and a controller 60.

In FIG. 10, the gantry 51 shows the cross section taken on the Y–Z plane. The static field magnet, the gradient magnetic field coil, the radio frequency coil, and the like are provided in the gantry 51. However, these components are omitted in FIG. 10. In addition, the MRI apparatus according to the third embodiment includes well-known various elements for performing the imaging. However, only the characteristic elements are shown in FIG. 10, and the other elements are omitted in FIG. 10.

The couch 52 includes a double type of top board formed by an upper top board 52*a* and a lower top board 52*b*. The couch 52 conveys the patient P placed on the upper top board 52*a* in the inside space of the gantry 51 by moving the upper top board 52*a* in the Z direction. There is a gap between the upper top board 52*a* and the lower board 52*b*, and the RF coil 53 is arranged in the gap. During the whole body scan, the upper top board 52*a* is moved and the lower top board 52*b* is not moved. Namely, the patient P placed on the upper top board 52*a* is conveyed between the RF coils 53 and 54.

The RF coil 53 is a multi type of reception coil. The RF coil 53 receives the magnetic resonance signal radiated from the patient P.

The RF coil 54 is a multi type of reception coil. The RF coil 54 is arranged in the inside space of the gantry 51. The RF coil 54 is connected to one end of the wire 55. The other end of the wire 55 is led to the outside of the gantry 51 by the pulleys 56 and 57 and connected to the hoisting device 58. The RF coil 54 is suspended by the wire 55. The pulleys 56 and 57 are attached to the gantry 51 by a supporting member.

The hoisting device 58 moves the RF coil 54 in the Y direction by hoisting or paying out the wire 55.

The sensor 59 is fixed to the RF coil 54, and the sensor 59 and the RF coil 54 are moved together. The sensor 59 senses the proximity between the RF coil 54 and the patient P.

The controller 60 controls the hoisting device 58 so that the RF coil 54 is brought close to the patient P while referring to the output of the sensor 59.

Figure 11:
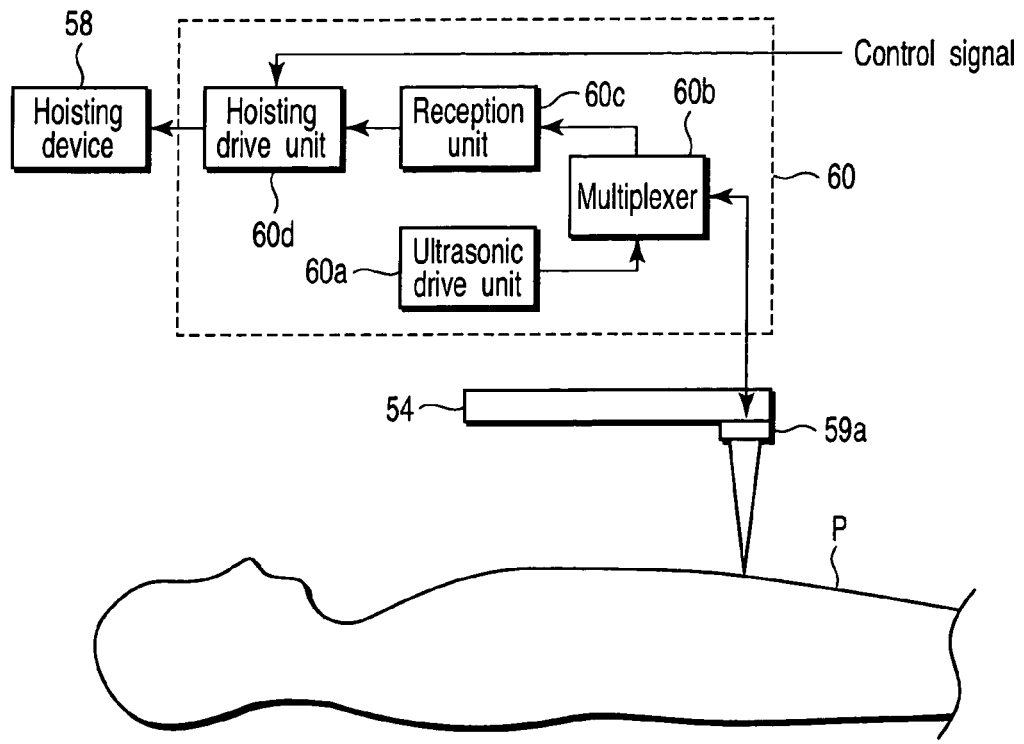
FIG. 11 is a diagram showing a detail configuration of a controller 60 in FIG. 10.

FIG. 11 shows a detail configuration of the controller 60 in FIG. 10.

The controller 60 includes an ultrasonic drive unit 60*a*, a multiplexer 60*b*, a reception unit 60*c*, and a hoisting drive unit 60*d*. In the configuration, an ultrasonic transducer 59*a* is used as the sensor 59.

The ultrasonic drive unit 60*a* outputs a transmission signal for transmitting the ultrasonic wave to the ultrasonic transducer 59*a*. The multiplexer 60*b* outputs the transmission signal outputted by the ultrasonic drive unit 60*a* to the ultrasonic transducer 59*a*. The multiplexer 60*b* outputs the signal outputted by the ultrasonic transducer 59*a* to the reception unit 60*c*. The reception unit 60*c* determines whether or not the distance between the RF coil 54 and the patient P is not more than a predetermined distance on the basis of the output signal of the ultrasonic transducer 59*a* which is inputted through the multiplexer 60*b*. When the distance between the RF coil 54 and the patient P is not more than the predetermined distance, the reception unit 60*c* outputs a detection signal to the hoisting drive unit 60*d*. The hoisting drive unit 60*d* drives the hoisting device 58 on the basis of the detection signal and a control signal transmitted from a computer system.

The operation of the MRI apparatus having the above-described configuration will be described below. Since the operation for obtaining the reconstructed image is similar to the first embodiment or the second embodiment, the description will be omitted. The position control of the RF coil 54 will be described.

The patient P is moved by the upper top board 52*a* whenever the image of the region corresponding to the reception range of the RF coils 53 and 54 is imaged.

Before the upper top board 52*a* is moved, a hoisting direction is given to the hoisting drive unit 60*d* by the control signal. In order to sufficiently raise the RF coil 54, the hoisting drive unit 60*d* drives the hoisting device 58 so as to wind the wire 55 in accordance with the hoisting instruction. After the RF coil 54 is separated from the patient P, the upper top board 52*a* is moved.

When the movement of the upper top board 52*a* is finished, a proximity instruction is given to the hoisting drive unit 60*d* by the control signal. The hoisting drive unit 60*d* drives the hoisting device 58 so as to pay out the wire 55 in accordance with the proximity instruction.

When the hoisting device 58 pays out the wire, the RF coil 54 is lowered and brought close to the patient P. At this point, the ultrasonic drive unit 60*a* intermittently outputs the transmission signal to cause the ultrasonic transducer 59*a* to transmit the ultrasonic wave. The reception signal 60*c* receives the signal, which is reflected from the patient P and received by the ultrasonic transducer 59*a*. The reception unit 60*c* determines whether or not a delay time from the transmission of the ultrasonic wave by the ultrasonic transducer 59*a* until the reception of the reflected signal becomes not more than a predetermined time corresponding to the predetermined distance. It is possible that the predetermined time is previously determined by calculation, or it is possible that the predetermined time is calibrated by measuring, for example, a phantom. The reception unit 60*c* outputs the detection signal when the delay time becomes not more than the predetermined time. The hoisting drive unit 60*d* stops the hoisting device 58 when the detection signal is outputted from the reception unit 60*c*.

Namely, the controller 60 stops the movement of the RF coil 54 when the RF coil 54 is brought close to the patient P up to the predetermined distance. Then, the magnetic resonance signal is received by the RF coils 53 and 54.

As described above, in accordance with the third embodiment, while the imaging region is changed by moving the patient P, the RF coil 54 is moved so that the distance between the RF coil 54 and each imaging region becomes the predetermined distance. The imaging is performed by receiving the magnetic resonance signal with the RF coils 53 and 54. As a result, the characteristics of the RF coil 54 can be sufficiently used to obtain the image with high quality. Since the RF coil 54 is not attached to the patient P, the additional burden is not placed on the patient P.

In order that the attachment position of the ultrasonic transducer 59*a* does not affect performance of the RF coil 54, it is desirable that the ultrasonic transducer 59*a* is arranged so as not to be located in each element. It is desirable that the ultrasonic transducer 59*a* is shielded with the radio shield material such as aluminum. As a frequency for use in transmission/reception of the ultrasonic wave, a relatively low frequency is used in order that the attenuation in the air is decreased. It is desirable that timing of the transmission/reception of the ultrasonic wave is set in the period when the pulse sequence of the MRI apparatus is not executed, or it is desirable that timing of the transmission/ reception of the ultrasonic wave is out of the period of the signal reception even if the pulse sequence is executed.

The following various modifications can be made in the third embodiment.

Figure 12:
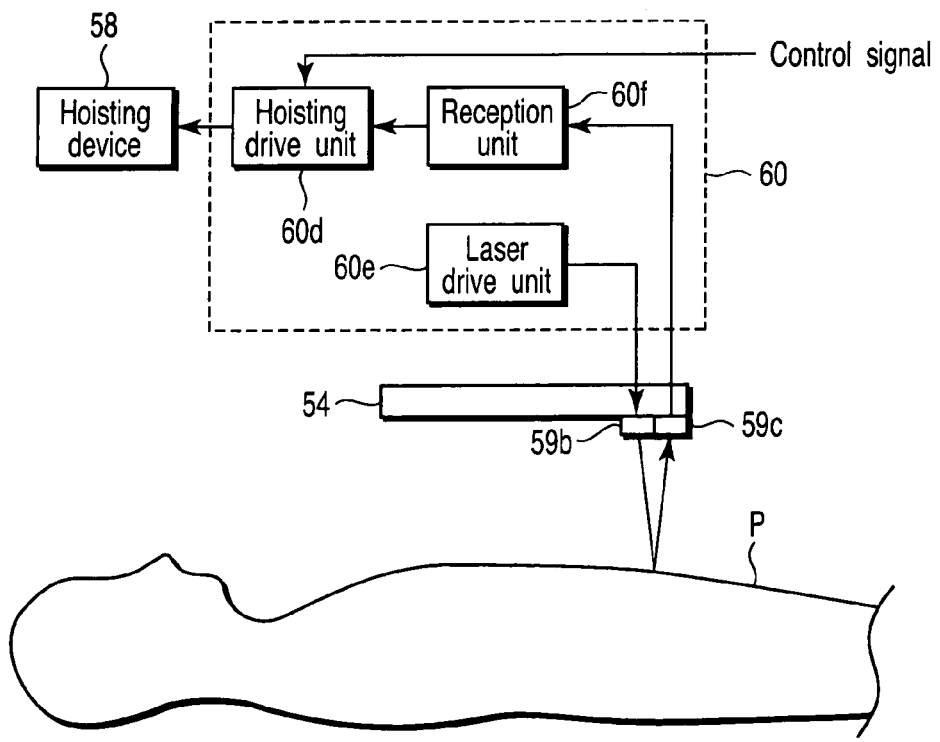
FIG. 12 is a diagram showing another configuration of the controller 60 in FIG. 10.

FIG. 12 shows another configuration of the controller 60 in FIG. 10. The component similar to that in FIG. 11 is represented by the same reference numeral, and the detail description will be omitted.

The controller 60 shown in FIG. 12 includes the hoisting drive unit 60*d*, a laser drive unit 60*e*, and a reception unit 60*f*. In the configuration, a laser oscillator 59*b* and a photodetector 59*c* are used as the sensor 59.

The laser drive unit 60*e* outputs the transmission signal for the laser oscillation to the laser oscillator 59*b*. The reception unit 60*f* determines whether or not the distance between the RF coil 54 and the patient P is not more than the predetermined distance on the basis of the output signal of the photodetector 59*c*. When the distance between the RF coil 54 and the patient P is not more than the predetermined distance, the reception unit 60*f* outputs the detection signal to the hoisting drive unit 60*d*.

In the configuration shown in FIG. 12, the proximity between the RF coil 54 and the patient P is detected on the basis of light intensity reflected from the patient P when the patient P is irradiated with a laser beam.

It is possible that a sheet for enhancing reflection efficiency of the laser beam adheres to the patient P, or it is possible that a coating or the like is applied to the patient P. Instead of the laser beam, it is possible that infrared light or the like is utilized. It is possible that the continuous laser beam is not used, and the laser beam is intermittently transmitted and received at the time when the data collection of the MRI apparatus is not interrupted.

FIG. 13A shows another configuration of the controller 60 in FIG. 10. The component similar to that in FIG. 11 is represented by the same reference numeral, and the detail description will be omitted.

The controller 60 shown in FIG. 13A includes the hoisting drive unit 60*d* and a reception unit 60*g*. In the configuration, a pressure sensor 59*d* and a pressure probe 59*e* are used as the sensor 59. The pressure probe 59*e* comes into contact with the patient P to transmit pressure to the pressure sensor 59*d*.

The reception unit 60*g* determines whether or not the distance between the RF coil 54 and the patient P is not more than the predetermined distance on the basis of the output signal of the pressure sensor 59*d*. When the distance between the RF coil 54 and the patient P is not more than the predetermined distance, the reception unit 60*g* outputs the detection signal to the hoisting drive unit 60*d*.

In the configuration shown in FIG. 13A, the proximity between the RF coil 54 and the patient P is detected on the basis of the pressure transmitted to the pressure sensor 59*d* when the pressure probe 59*e* comes into contact with the patient P. The reception unit 60*g* outputs the detection signal when the pressure sensor 59*d* senses the pressure having a predetermined value or more.

As shown in FIG. 13B, it is also possible that the pressure sensor 59*d* is attached to a leading point of a supporting member 59*f* attached to the RF coil 54 and the pressure sensor 59*d* comes into contact with the patient P. It is possible that the pressure probe 59*e* is formed in a plane shape, or it is possible to use the plurality of pressure probes 59*e*. It is also possible that the pressure sensors 59*d* are arranged at a plurality of positions. It is possible that the pressure sensor 59*d* is formed in a plane shape (sheet shape), or it is possible that the pressure sensor 59d is formed in a grid shape which avoids the element unit of the RF coil 54.

FIG. 14 shows another configuration of the controller 60 in FIG. 10. The component similar to that in FIG. 11 is represented by the same reference numeral, and the detail description will be omitted.

The controller 60 shown in FIG. 14 includes the hoisting drive unit 60d and a determination unit 60h. In the configuration, a micro switch 59g and a probe 59h are used as the sensor 59. The probe 59h is displaced to turn on the micro switch 59g when the probe 59h comes into contact with the patient P.

The determination unit 60h determines whether or not the distance between the RF coil 54 and the patient P is not more than the predetermined distance on the basis of the output signal of the micro switch 59g. When the distance between the RF coil 54 and the patient P is not more than the predetermined distance, the determination unit 60h outputs the detection signal to the hoisting drive unit 60d.

In the configuration shown in FIG. 14, the proximity between the RF coil 54 and the patient P is detected on the basis of the turning-on of the micro switch 59g by the contact of the probe 59h with the patient P.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
a static magnetic field generation unit which generates a static magnetic field in a gantry;
a gradient magnetic field generation unit which applies a gradient magnetic field to an object in the static magnetic field;
radio frequency coil which receives an MRI magnetic resonance signal from the object to which the gradient magnetic field is applied;
a controller which detects a contour of the object;
a coil movement unit which moves the radio frequency coil transversely towards or away from the object on the basis of the detected contour to maintain a predetermined separation limit between the coil and the object while the radio frequency coil is positioned longitudinally relative to the object to receive MRI signals; and
an image generation unit which generates a magnetic resonance image on the basis of the received magnetic resonance signal.

2. A magnetic resonance imaging apparatus according ot claim 1, further comprising an object movement unit which moves the object,
wherein the coil movement unit moves the radio frequency coil in accordance with the movement of the object.

3. A magnetic resonance imaging apparatus according to claim 2, wherein the controller detects the contour on the basis of the magnetic resonance signal which is received when the object movement unit moves the object in a first direction, and
the coil movement unit moves the radio frequency coil when the object movement unit moves the object in a second direction which is the opposite of the first direction.

4. A magnetic resonance imaging apparatus according to claim 3, further comprising a whole body coil which receives the magnetic resonance signal from the object, wherein the controller detects the contour on the basis of the magnetic resonance signal received by the whole body coil.

5. A magnetic resonance imaging apparatus according to claim 4, wherein the image generation unit generates a pre-scan image of the object on the basis of the magnetic resonance signal received by the whole body coil, and
the controller detects the contour on the basis of the pre-scan image.

6. A magnetic resonance imaging apparatus according to claim 3, further comprising a condition detection unit which detects a imaging condition of the case where the object movement unit moves the object in the second direction, when the object movement unit moves the object in the first direction,
wherein the radio frequency coil receives the magnetic resonance signal under the detected imaging condition.

7. A magnetic resonance imaging apparatus according to claim 6, wherein the condition detection unit detects transmission power data of the magnetic resonance signal.

8. A magnetic resonance imaging apparatus according to claim 6, wherein the condition detection unit detects shimming data.

9. A magnetic resonance imaging apparatus according to claim 6, wherein the condition detection unit detects sensitivity distribution data.

10. A magnetic resonance imaging apparatus according to claim 6, wherein the condition detection unit detects tuning data.

11. A magnetic resonance imaging apparatus according to claim 2, wherein the controller detects the contour on the basis of the magnetic resonance signal which is received when the object movement unit moves the object in a first direction, and
the coil movement unit moves the radio frequency coil when the object is moved in the same direction as the first direction.

12. A magnetic resonance imaging apparatus according to claim 1, wherein the radio frequency coil is a coil for local imaging.

13. A magnetic resonance imaging apparatus comprising:
a static magnetic field generation unit which generates a static magnetic field in a gantry;
a gradient magnetic field generation unit which applies a gradient magnetic field to a object in the static magnetic field;
a radio frequency coil which receives a magnetic resonance signal from the object to which the gradient magnetic field is applied;
a controller which detects a contour of the object on the basis of the magnetic resonance signal received by the radio frequency coil;
a coil movement unit which moves the radio frequency coil transversely towards or away from the object on the basis of the detected contour to maintain a predetermined separation limit between the coil and the object while the radio frequency coil is positioned longitudinally relative to the object to receive MRI signals; and
an image generation unit which generates a magnetic resonance image on the basis of the magnetic resonance signal received by the radio frequency coil that is moved by the coil movement unit.

14. A magnetic resonance imaging apparatus according to claim 13, further comprising a object movement unit which moves the object,
wherein the coil movement unit moves the radio frequency coil in accordance with the movement of the object.

15. A magnetic resonance imaging apparatus according to claim 14, wherein the controller detects the contour on the basis of the magnetic resonance signal which is received when the object movement unit moves the object in a first direction, and
the coil movement unit moves the radio frequency coil when the object is moved in the same direction as the first direction.

16. A magnetic resonance imaging apparatus according to claim 13, wherein the radio frequency coil is a coil for local imaging.

17. A magnetic resonance imaging apparatus comprising:
a static magnetic field generation unit which generates a static magnetic field in a gantry;
a gradient magnetic field generation unit which applies a gradient magnetic field to a object in the static magnetic field;
a radio frequency coil which receives a magnetic resonance signal from the object to which the gradient magnetic field is applied;
a sensor which measures a thickness of the object;
a coil movement unit which moves the radio frequency coil in a direction of the thickness on the basis of the detected thickness; and
an image generation unit which generates a magnetic resonance image on the basis of the received magnetic resonance signal.

18. A magnetic resonance imaging apparatus according to claim 17, wherein the sensor is an ultrasonic sensor which transmits/receives an ultrasonic wave to/from the object.

19. A magnetic resonance imaging apparatus according to claim 17, wherein the sensor is a photo sensor which transmits/receives light to/from the object.

20. A magnetic resonance imaging apparatus according to claim 17, wherein the sensor is provided in the gantry.

21. A magnetic resonance imaging apparatus according to claim 17, wherein the sensor is provided in a side face of the gantry.

22. A magnetic resonance imaging apparatus according to claim 17, further comprising a second coil movement unit which moves the radio frequency coil to an imaging area in the static magnetic field.

23. A magnetic resonance imaging apparatus according to claim 22, wherein the coil movement unit which moves the radio frequency coil in the thickness direction is attached so as to engage the second coil movement unit.

24. A magnetic resonance imaging apparatus according to claim 17, wherein the radio frequency coil is detachable.

25. A magnetic resonance imaging apparatus according to claim 17, further comprising a couch movement unit which moves a couch on which the object is placed in the thickness direction in accordance with the thickness of the object.

26. A magnetic resonance imaging apparatus comprising:
a static magnetic field generation unit which generates a static magnetic field in a gantry;
a gradient magnetic field generation unit which applies a gradient magnetic field to a object in the static magnetic field;
a radio frequency coil which receives a magnetic resonance signal from the object to which the gradient magnetic field is applied;
a sensor which detects a proximity state between the radio frequency coil and the object;
a coil movement unit which moves the radio frequency coil on the basis of the detected proximity state; and
an image generation unit which generates a magnetic resonance image on the basis of the received magnetic resonance signal.

27. A magnetic resonance imaging apparatus according to claim 26, wherein the sensor is provided in the radio frequency coil.

28. A magnetic resonance imaging apparatus according to claim 26, wherein the radio frequency coil is a multi-coil.

29. A magnetic resonance imaging apparatus according to claim 26, further comprising a couch having a first top board which directly supports the object and a second top board which is provided in a lower portion of the first top board and movably supports the first board.

30. A magnetic resonance imaging apparatus according to claim 29, further comprising a second radio frequency coil provided between the first top board and the second top board.

31. A magnetic resonance imaging apparatus according to claim 26, wherein the sensor is an ultrasonic sensor which transmits/receives an ultrasonic wave to/from the object.

32. A magnetic resonance imaging apparatus according to claim 26, wherein the sensor is a photo sensor which transmits/receives light to/from the object.

33. A magnetic resonance imaging apparatus according to claim 26, wherein the sensor is a pressure sensor which comes into contact with the object to sense pressure.

34. A magnetic resonance imaging apparatus comprising:
a static magnetic field generation unit which generates a static magnetic field in a gantry;
a gradient magnetic field generation unit which applies a gradient magnetic field to a object in the static magnetic field;
a radio frequency coil which receives a magnetic resonance signal from the object to which the gradient magnetic field is applied;
a top board on which the object is placed;
a coil movement unit which moves the radio frequency coil transversely towards or away from the object on the basis of the detected contour to maintain a predetermined separation between the coil and the object while the radio frequency coil is positioned longitudinally relative to the object to receive MRI signals; and
an image generation unit which generates a magnetic resonance image on the basis of the received magnetic resonance signal.

35. An image generation method in magnetic resonance imaging apparatus comprising: a static magnetic field generation unit which generates a static magnetic field in a gantry; a gradient magnetic field generation unit which applies a gradient magnetic field to a object in the static magnetic field; a radio frequency coil which receives a magnetic resonance signal from the object to which the gradient magnetic field is applied, the image generation method comprising:
detecting a contour of the object;
moving the radio frequency coil transversely towards or away from the object on the basis of the detected contour to maintain a predetermined separation limit between the coil and the object while the radio frequency coil is positioned longitudinally relative to the object to receive MRI signals; and
generating a magnetic resonance image on the basis of the received magnetic resonance signal.

36. An image generation method in a magnetic resonance imaging apparatus comprising: a static magnetic field generation unit which generates a static magnetic field in a gantry; a gradient magnetic field generation unit which applies a gradient magnetic field to a object in the static magnetic field; and a radio frequency coil which receives a magnetic resonance signal from the object to which the gradient magnetic field is applied, the image generation method comprising:

detecting a contour of the object on the basis of the magnetic resonance signal received by the radio frequency coil;

moving the radio frequency coil transversely towards or away from the object on the basis of the detected contour to maintain a predetermined separation limit between the coil and the object while the radio frequency coil is positioned longitudinally relative to the object to receive MRI signals; and generating a magnetic resonance image on the basis of the magnetic resonance signal received by the moved radio frequency coil.

37. An image generation method in a magnetic resonance imaging apparatus comprising: a static magnetic field generation unit which generates a static magnetic field in a gantry; a gradient magnetic field generation unit which applies a gradient magnetic field to a object in the static magnetic field; and a radio frequency coil which receives a magnetic resonance signal from the object to which the gradient magnetic field is applied, the image generation method comprising:

measuring a thickness of the object;

moving the radio frequency coil in a direction of the thickness on the basis of the measured thickness; and generating a magnetic resonance image on the basis of the received magnetic resonance signal.

38. An image generation method in a magnetic resonance imaging apparatus comprising: a static magnetic field generation unit which generates a static magnetic field in a gantry; a gradient magnetic field generation unit which applies a gradient magnetic field to a object in the static magnetic field; and a radio frequency coil which receives a magnetic resonance signal from the object to which the gradient magnetic field is applied, the image generation method comprising:

detecting a proximity state between the radio frequency coil and the object;

moving the radio frequency coil on the basis of the detected proximity state; and generating a magnetic resonance image on the basis of the received magnetic resonance signal.

39. An image generation method in a magnetic resonance imaging apparatus comprising: a static magnetic field generation unit which generates a static magnetic field in a gantry; a gradient magnetic field generation unit which applies a gradient magnetic field to a object in the static magnetic field; a radio frequency coil which receives a magnetic resonance signal from the object to which the gradient magnetic field is applied; and a top board on which the object is loaded, the image generation method comprising:

moving the radio frequency coil on the basis of a position of the top board while the radio frequency coil is automatically positioned relative to a detected contour of the object; and generating a magnetic resonance image on the basis of the detected magnetic resonance signal.

\* \* \* \* \*